United States Patent [19]

Lanoe

[11] Patent Number: 5,532,430
[45] Date of Patent: Jul. 2, 1996

[54] RECEIVING HOUSING FOR DISSIPATOR ELECTRONIC COMPONENTS

[75] Inventor: Thierry Lanoe, Cergy, France

[73] Assignee: Societe d'Applications Generales d'Electricate et de Mecanique SAGEM, France

[21] Appl. No.: 117,171

[22] PCT Filed: Jan. 14, 1993

[86] PCT No.: PCT/FR93/00037

§ 371 Date: Dec. 28, 1993

§ 102(e) Date: Dec. 28, 1993

[87] PCT Pub. No.: WO93/14614

PCT Pub. Date: Jul. 22, 1993

[30] Foreign Application Priority Data

Jan. 14, 1992 [FR] France .................. 92 00297

[51] Int. Cl.⁶ .................................................. H05K 5/06
[52] U.S. Cl. .................... 174/52.3; 174/59; 361/707; 361/714
[58] Field of Search .................. 174/35 R, 356, 174/52.1, 52.3, 52.4, 59; 361/704, 707, 712, 714, 743, 800, 816, 818

[56] References Cited

U.S. PATENT DOCUMENTS

| | | | |
|---|---|---|---|
| 3,989,333 | 11/1976 | Cauldwell | 174/60 X |
| 4,339,260 | 7/1982 | Johnson et al. | 65/160 |
| 4,763,225 | 8/1988 | Frenkel et al. | 361/709 |
| 5,103,375 | 4/1992 | Cottingham et al. | 29/832 X |
| 5,321,583 | 6/1994 | McMahon | 361/770 |
| 5,392,197 | 2/1995 | Cuntz et al. | 174/35 R X |
| 5,414,597 | 5/1995 | Lindland et al. | 174/35 R X |

FOREIGN PATENT DOCUMENTS 4323319   12/1991   Germany .

Primary Examiner—Kristine L. Kincaid
Assistant Examiner—Christopher Horgan
Attorney, Agent, or Firm—Graham & James

[57] ABSTRACT

The components (13, 14) are mounted on a two-faced printed circuit (22) fastened to a metal heat-conductive substrate (12) which is integral with the housing and to which a connector (8) is electrically connected which is also integral with the housing and is arranged on the same side of the substrate (12) as the printed circuit (22). The metal heat-conductive substrate (12) has a cutout to serve as support for the connector (8) which is soldered on the face of the printed circuit (22) facing the substrate (12) at the place of the cutout. The invention is advantageous for switches associated with computer controlled actuators.

4 Claims, 2 Drawing Sheets

RECEIVING HOUSING FOR DISSIPATOR ELECTRONIC COMPONENTS

BACKGROUND OF THE INVENTION

1. Field of the Invention

The present invention relates to a housing for energy-dissipating electronic components mounted on a double-faced printed circuit board. The circuit board is fastened to a heat-conductive metal substrate, which is integral with the housing. A connector also integral with the housing is electrically connected to the circuit board. The connector is located on the same side of the substrate as the printed circuit.

2. Discussion of Related Art

Today, using a printed circuit board on a heat-conductive metal substrate is frequently proposed as solution for the problem of dissipating the heat of power components. Two sets of copper lands are printed on the either side of a not very thick flexible layer of polymide-type or Kapton-brand insulating material, and the double-faced circuit thus formed is bonded onto the metal substrate. In the field of automobile electronics, for instance, this is referred to as a "power flex board". This field, as well as others, requires products that have high-reliability and low cost even though they are subject to severe operating conditions. Temperature is one of the factors affecting this reliability. For example, the electronic switches for power actuators controlled by an electronic computer, dissipate energy and it is absolutely necessary to cool them in order to preserve their reliability. The power flex boards described above assure the necessary cooling.

A problem remains, namely the placement of the connector. Use of SMC-type (surface-mounted component) connectors has been proposed, but it is difficult to solder on the side of the metal substrate where the flexible board is located, as the printed circuit and its components do not withstand two solderings. Soldering the connecting lugs of a conventional connector to one edge of the flex board that protrudes from the metal substrate and then introducing the board-connector assembly into the housing and, finally, to fastening both of them to the housing with screws, clips, or other similar means, has also been proposed. However, this solution also has drawbacks. Between the time when this board connector is assembled by soldering the connections, and the time of its attachment, it undergoes stresses because of the lack of rigidity of the board connector assembly. Thermal resistance between the metal substrate of the board and the housing degrades the reliability of control and drive devices, such as the computer devices referred to above. Finally, the housing must be shaped so as to have a recess, shaped like a tub, to hold the free ends of the connecting lugs of the connector.

SUMMARY OF THE INVENTION

The present invention is directed to overcoming all these problems. Thus, it provides a housing of the above mentioned type wherein the metal heat-conductive substrate comprises a cutout adapted to support the connector, which is soldered on the face of the printed circuit that faces the substrate at the location of the cutout.

In accordance with the invention, the connector is fastened to the housing indirectly, via the substrate, and the combination of the printed circuit and the connector assembly is no longer flexible before attachment to the housing. Finally, the conventional connector of the housing in accordance with the invention is used, so to speak, as a reverse SMC component, that is to say, through the use of a printed circuit soldering face opposite that of the SMC components.

The invention permits a conventional connector to be used and fastened rapidly to the substrate. Mounting this connector is thus greatly simplified. After soldering the components and the connector, the rigid assembly can easily be fastened to the housing.

The substrate cutout is preferably provided at the center of an edge. Furthermore, the connector is preferably separated from the dissipative components by an electromagnetic shielding lip. Also, the housing is preferably open on the side of the substrate opposite the side to which the printed circuit is fastened, which eliminates any thermal resistance between the housing and the substrate and improves the heat-dissipation capacity.

BRIEF DESCRIPTION OF THE DRAWINGS

The invention will be better understood by considering the following description of the preferred embodiment of the housing of the invention, with reference to the accompanying drawings, in which.

DETAILED DESCRIPTION OF THE PREFERRED EMBODIMENT

Figure 4:
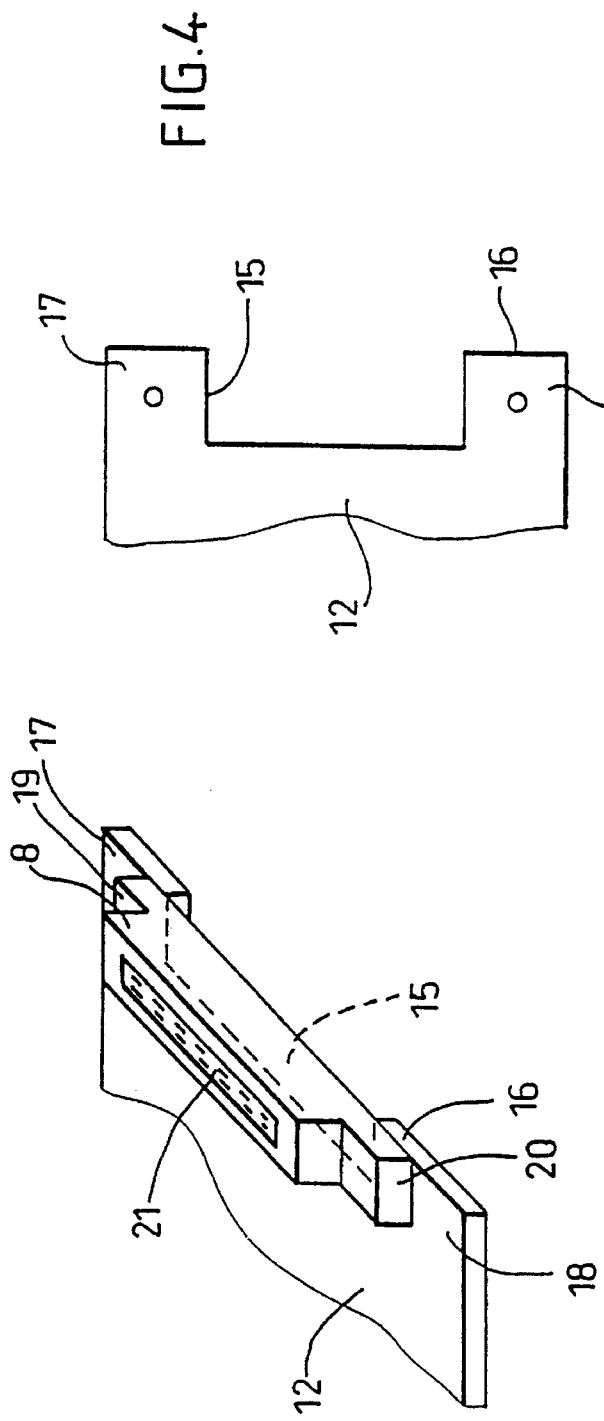
FIG. 4 is a top view of the edge of the substrate which is the support of the connector.
Figure 5:
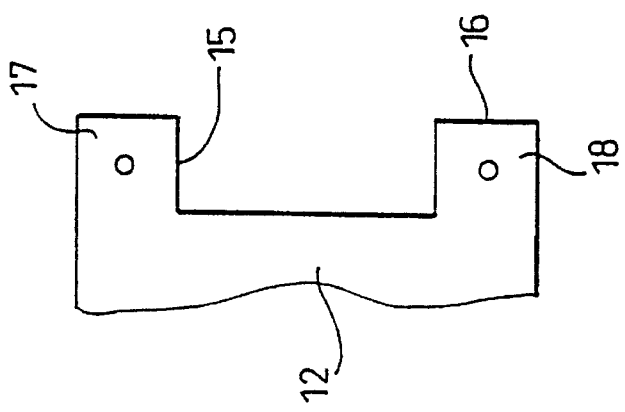
FIG. 5 is a perspective view of the edge of the substrate of FIG. 4, after attachment of the connector.
Figure 1:
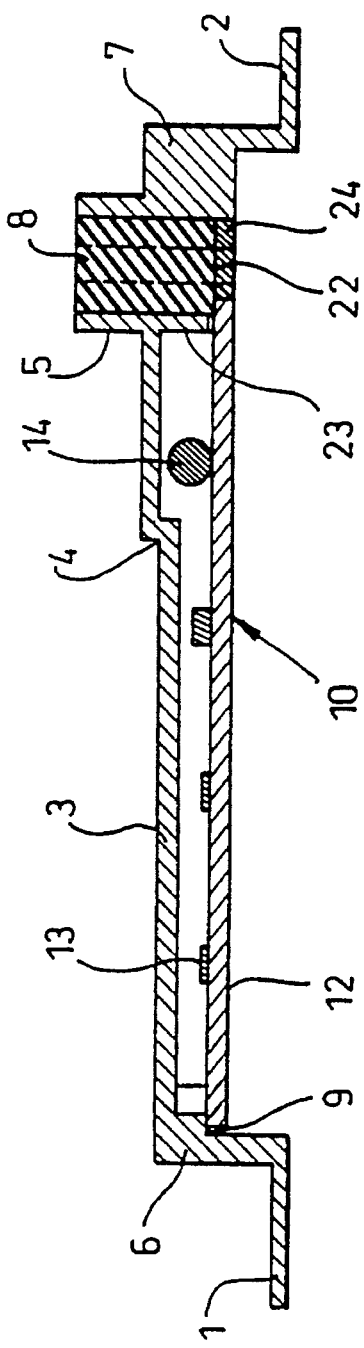
FIG. 1 is a view of the housing in longitudinal cross-section.

In FIG. 1, the housing is a molded aluminum housing of generally parallelepiped shape with an open bottom, which is provided with fastening lugs 1, 2 at its two longitudinal ends. An upper enclosure wall 3 extends between the fastening lugs acting as cover.

The wall 3 has a first transverse shoulder 4 to provide for different sizes of components. The wall 3 has a second transverse shoulder 5, which is higher than the first shoulder, because of the size of the connector 8, which will be referred to below. The wall 3 is connected to the fastening lugs on the one side by a higher, thick, transverse side wall 7, which in cooperation with the shoulder 5, holds the connector 8. An inner shoulder 9 is provided on the transverse side wall 6 and the two longitudinal side walls of the housing, substantially half way up the wall 6, at the level of the second shoulder 5, for receiving a component board 10.

Figure 3:
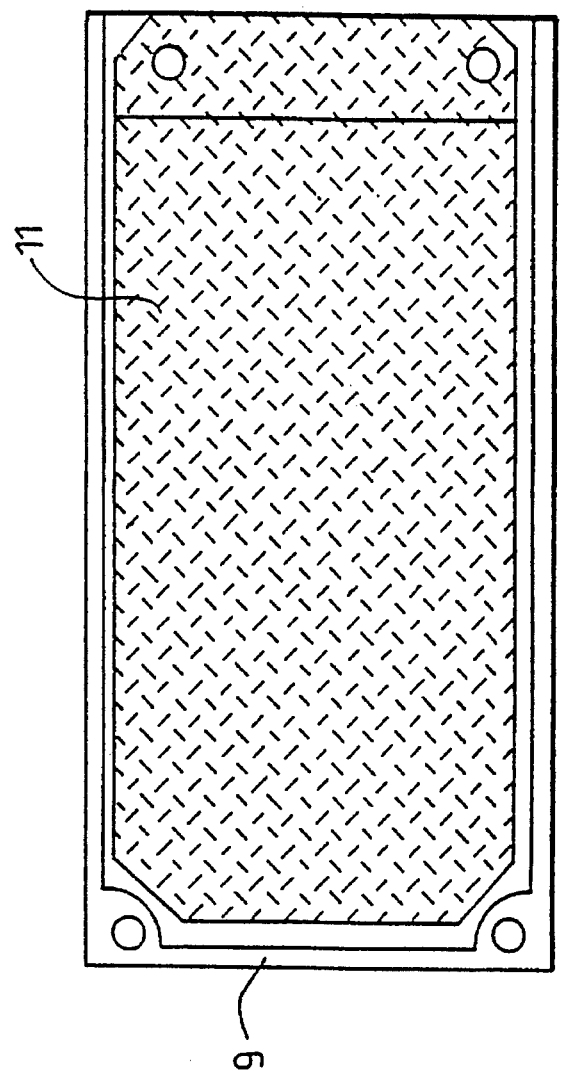
FIG. 3 is a view similar to FIG. 2, after attachment of the support.

The housing contains a component board 10. The component board 10 rests against the shoulder 9. The component board has a double-faced printed circuit 22, with a printed area 11 thereof as shown in FIG. 3, which faces the opening of the housing and is secured to a heat-conductive metal substrate 12. Energy-dissipating SMC electronic components are soldered on the face of the printed circuit facing the enclosure wall 3, some 13 having relatively low profile and others 14, located between the two shoulders 4, 5, being taller.

Figure 2:
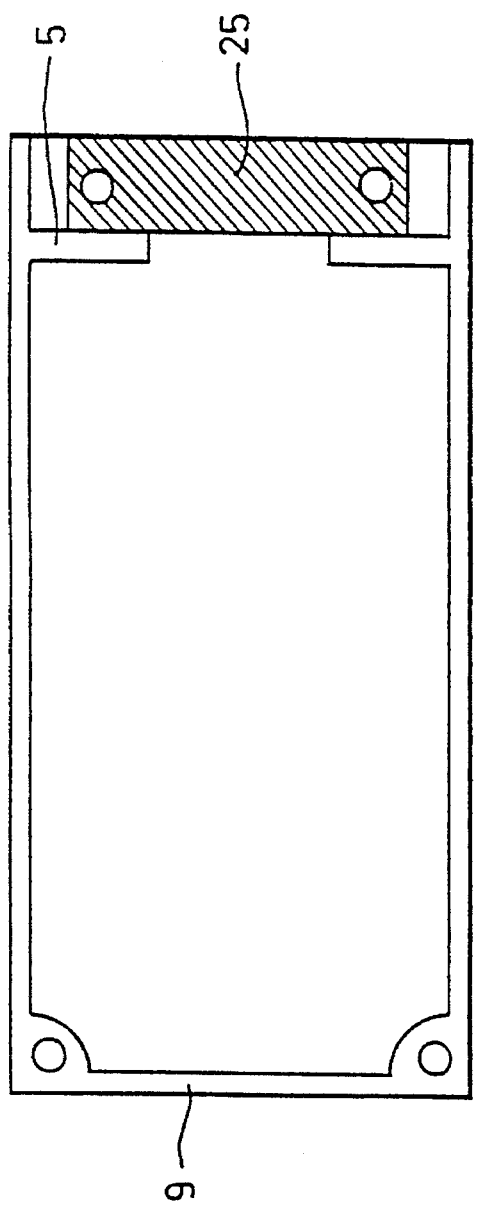
FIG. 2 is a view of the underside of the part of the housing which supports the components.

The substrate 12 is shaped by a cutout 15, a rectangular one here, at the center of a transverse edge 16 of the substrate 12. The cutout 15 forms two lateral extensions 17, 18 which serve as supports for two fastening lugs 19, 20 of the connector 8. The connector's assembly of connecting terminals 21 is positioned above the cutout 15, and the part of the printed circuit 22 to which the terminals are soldered, the surface of the printed circuit 22 facing the substrate 12, that is, the face other opposite to that of the components 13, 14. The foot print 25 of the connector 8 contacting the printed circuit 22 is shown in FIG. 2. The connector 8 is separated from the components 13, 14 by an electromagnetic shielding lip 23 which extends the shoulder 5 towards the opening of the housing.

The housing is easy to produce. The housing itself is molded, of aluminum here. A rectangular blank of aluminum is used to form the heat-conductive substrate 12 and the cutout 15 produces the extensions 17, 18. An insulating flexible plate, for instance, a plate of polymide, conductive tracks are printed to form the double-face printed circuit 22. On two faces of the plate having dimensions which are only very slightly less than those of the substrate 12 is used. Openings for metallized holes are punched there. The circuit 22 is fastened to the substrate 12, in this case by bonding. The components 13, 14 are placed on that face of the circuit 22 intended to face the enclosure wall 3 of the housing and are soldered on said face. The connector 8 is placed, by its lugs 19, 20, on the same face of the circuit 22 as the components 13, 14; the lugs are fastened to the extensions 17, 18 of the substrate 12, and its connecting terminals 21 are soldered on the other face of the circuit 22. The assembly is introduced into the housing and fastened in it against the shoulder 9. Finally, by way of protection, some resin 24 is deposited around the solder points of the terminals of the connector 8. The substrate 12 thus closes the housing 3.

I claim:

1. A housing and circuit board assembly for energy-dissipating electronic components (13, 14) mounted on a double-faced printed circuit (22), where the printed circuit (22) is fastened on one face thereof to a first side of a metal heat-conductive substrate (12) where said substrate (12) is integrated with the housing assembly, said housing assembly comprising:

a connector (8) which is also integrated with the housing assembly and is arranged on the same first side of the substrate (12) as the printed circuit (22); and a cutout (15) in the metal heat-conductive substrate (12), where the connector (8) is supported by the substrate proximate to said cutout (15) and is soldered to the face of the printed circuit (22) facing the substrate (12) above the cutout (15).

2. A housing according to claim 1, in which the cutout (15) of the substrate (12) is provided from a central part of an edge (16).

3. A housing according to claim 1, in which the connector (8) is separated from the energy-dissipating components (13, 14) by an electromagnetic shielding lip (23).

4. A housing according to claim 1, in which the housing is open on a second side of the substrate (12) opposite to the first side to which the printed circuit (22) is fastened.

* * * * *